US008164043B2

(12) United States Patent
Tamura et al.

(10) Patent No.: US 8,164,043 B2
(45) Date of Patent: Apr. 24, 2012

(54) OPTICAL MODULE WITH FIBER HOLDING FERRULE

(75) Inventors: Mitsuaki Tamura, Yokohama (JP); Wataru Sakurai, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 351 days.

(21) Appl. No.: 12/532,310

(22) PCT Filed: Nov. 21, 2008

(86) PCT No.: PCT/JP2008/071196
§ 371 (c)(1),
(2), (4) Date: Sep. 21, 2009

(87) PCT Pub. No.: WO2009/069540
PCT Pub. Date: Jun. 4, 2006

(65) Prior Publication Data

US 2010/0108868 A1 May 6, 2010

(30) Foreign Application Priority Data

Nov. 26, 2007 (JP) ................................ 2007-303996

(51) Int. Cl.
*G01J 1/04* (2006.01)

(52) U.S. Cl. ............................. 250/227.11; 250/227.24

(58) Field of Classification Search .................. 250/239, 250/227.11, 216, 551, 227.21–227.24; 385/33–37, 385/88–93
See application file for complete search history.

(56) References Cited

U.S. PATENT DOCUMENTS 5,065,011 A * 11/1991 Fujihara et al. .......... 250/227.24
7,118,294 B2 10/2006 Hamasaki et al.
7,301,139 B1 11/2007 Sakurai et al.
2008/0095505 A1 4/2008 Sakurai et al.

FOREIGN PATENT DOCUMENTS

JP H05-190910 A 7/1993
JP H05-0648096 U 8/1993
JP 2004-317626 A 11/2004
JP 2004-317627 A 11/2004
JP 2005-043622 A 2/2005
JP 2005-099510 A 4/2005
JP 2007-067288 A 3/2007

OTHER PUBLICATIONS

The Office Action of the corresponding Chinese Patent Application No. 200880009654.3, dated Jul. 6, 2011.

* cited by examiner

*Primary Examiner* — Que T Le
(74) *Attorney, Agent, or Firm* — Global IP Counselors, LLP

(57) ABSTRACT

An optical module is configured such that it is not susceptible to fine particulate matter when an optical fiber is inserted into a fiber insertion hole thereof. The optical module is also configured to prevent any reduction in the optical coupling efficiency and degradation of anti-noise properties with the optical fiber. The optical module includes: a ferrule, having the fiber insertion hole formed on an end surface on which an electrical circuit is formed; a photoelectric conversion element, connected to the electrical circuit and facing the fiber insertion hole; and an optical fiber, optically coupled directly with the photoelectric conversion element. The optical fiber has a glass fiber and a protective coating, and is aligned with the insertion hole with the protective coating interposed therebetween. The optical fiber is retained in the insertion hole with the glass fiber not in contact with the insertion hole.

7 Claims, 3 Drawing Sheets

100 31 13 5 37 1 11 9 21 9a 11 37 35 39 33

OPTICAL MODULE WITH FIBER HOLDING FERRULE

CROSS-REFERENCE TO RELATED APPLICATIONS

This U.S. National stage application claims priority under 35 U.S.C. §119(a) to Japanese Patent Application No. 2007-303996, filed in Japan on Nov. 26, 2007, the entire contents of which are hereby incorporated herein by reference.

TECHNICAL FIELD

The present invention relates to an optical module, which comprises a device array in which photoelectric conversion elements are arranged and a ferrule into which optical fibers are inserted, wherein the photoelectric conversion elements are optically coupled directly with the optical fibers.

BACKGROUND ART

An optical semiconductor module (optical module) wherein an optical fiber and a photoelectric conversion element are directly optically coupled (butt joint) without an optical element such as a lens interposed therebetween is described in JP-A 2005-43622. Region (a) of FIG. 5 is a cross-sectional view showing a conventional optical module prior to assembling. The optical module has a device array 1 and an optical ferrule 3.

The device array 1 has a coupling surface 5, and a plurality of photoelectric conversion elements 9 are arranged in one row (in a direction perpendicular to the plane of the drawing) at the center section of the coupling surface 5. A plurality of bumps 11, arranged parallel to the row of photoelectric conversion elements 9, function as connecting terminals for the elements. The ferrule 3 has a coupling surface 7, and a plurality of optical fiber insertion holes 15 for holding an optical fiber 13 in position are arranged in an open state in one row on the coupling surface 7. A plurality of electrical circuits (not shown) connected to the bumps 11 are arranged on the coupling surface 7 in parallel to the row direction of the insertion holes 15, and are continuously formed up to an orthogonal surface adjacent to the coupling surface 7. The ferrule 3 is made of a material containing a polyester resin, a PPS resin, or an epoxy resin.

The device array 1 and the ferrule 3 are arranged so that the coupling surface 5 and the coupling surface 7 face each other. The insertion hole 15 and the photoelectric conversion element are positionally aligned, and the bump 11 is secured to the electrical wiring, whereby the ferrule 3 and the device array 1 are integrally coupled. An appropriate length of a protective coating 19 is removed at a distal end of the optical fiber 13 to expose a glass fiber 21, and the optical fiber 13 is inserted into the insertion hole 15, so that the optical fiber 13 is optically coupled with the photoelectric conversion element 9. The optical fiber 13 is positionally aligned with the optical fiber ferrule 3 by a position-restricting hole section 15*a* in the insertion hole 15, the diameter of the hole section 15*a* being smaller on the coupling surface 7 side. Specifically, the optical fiber 13 is positionally aligned by the glass fiber 21 without the coating 19 being interposed therebetween.

Region (b) of FIG. 5 is an enlarged cross-sectional view of a section at the periphery of the distal end of the glass fiber 21 of a conventional optical module under assembling. When the glass fiber 21 is inserted into the insertion hole 15, the distal end of the glass fiber 21 may scrape against a plastic material that is softer than the glass fiber 21 such as an inner peripheral surface of the position-restricting hole section 15*a*. Fine particulate matter can be produced when the inner peripheral surface is so abraded. This particulate may also be present within the insertion hole 15. In some instances, the particulate 25 adheres to a surface 21*a* on the distal end of the glass fiber 21, reducing the efficiency of optical coupling with the device array 1, and degrading the anti-noise property of the optical module.

SUMMARY OF THE INVENTION

Technical Problem

An object of the present invention is to provide an optical module that does not produce fine particulate matter when an optical fiber is inserted into the fiber insertion hole, and thus to prevent a reduction of the optical coupling efficiency of the optical module and a degradation of the anti-noise property of the optical module.

Technical Solution

In order to achieve the object, there is provided an optical module, comprising: a ferrule, having a fiber insertion hole formed on an end surface on which an electrical circuit is formed; a photoelectric conversion element, connected to the electrical circuit and facing the fiber insertion hole; and an optical fiber, optically coupled directly with the photoelectric conversion element. The optical fiber comprises a glass fiber and a protective coating and is held in the fiber insertion hole in a state where it is positionally aligned in the fiber insertion hole with the protective coating interposed therebetween, and the glass fiber is not in contact with the optical fiber insertion hole.

The glass fiber may protrude by a length L from the protective coating at a distal end section of the optical fiber. The fiber insertion hole may have a holding section, a tapered section, and an expanded-diameter section arranged in order from the end surface side. In such an instance, the optical fiber is held in the fiber insertion hole at the holding section; and the protrusion length L is such that a rim at the distal end surface of the glass fiber is not in contact with the tapered section when a rim of the protective coating is in a state of contact with the tapered section. The protrusion length L is preferably 5 μm or more and 100 μm or less. The distal end of the protective coating is preferably positioned within the fiber insertion hole. The protective coating material and the glass fiber are preferably severed together at the distal end section of the optical fiber by being irradiated with a laser from above the protective coating.

DETAILED DESCRIPTION OF THE INVENTION

Figure 1:
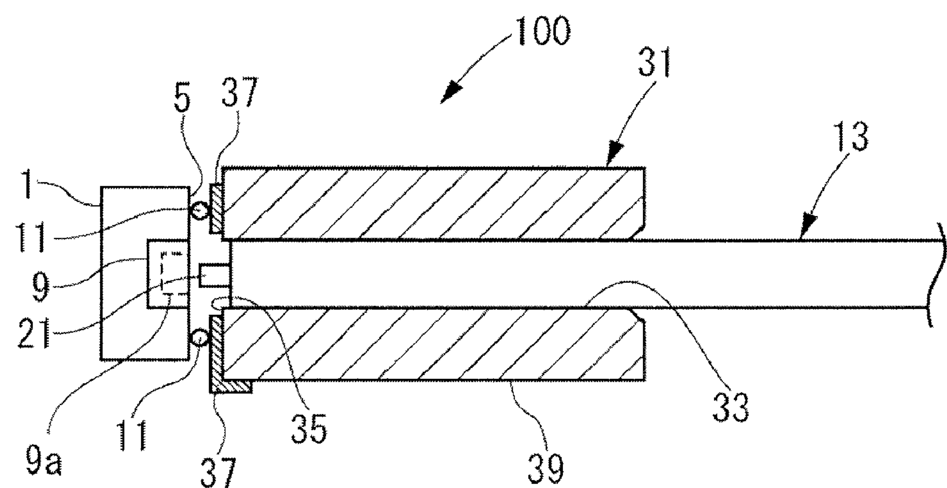
FIG. 1 is a cross-sectional view of an optical module that is an embodiment of the present invention.

An embodiment of the present invention will now be described with reference to the drawings. The drawings are used for the purpose of illustration, and are not intended to limit the scope of the invention. In order to avoid repetition in the description, identical labels are used in the drawings to indicate identical sections. The scales used in the drawings are not necessarily accurate.

FIG. 1 is a cross-sectional view of an optical module 100 that is an embodiment of the present invention. The optical module 100 comprises a device array 1, a plurality of optical fibers 13, and an optical ferrule 31.

The device array 1 has a plurality of photoelectric conversion elements 9 arranged in one row (in a direction perpendicular to the plane of the drawing) on a surface (coupling surface 5) of the device array 1, the surface facing the ferrule 31. Representative examples of the photoelectric conversion element 9 are a surface-emitting laser (VCSEL) if used as a light source part, or a photo-detector (PD) if used as a light-receiving part. The pitch at which the photoelectric conversion elements are arranged is, e.g., 250 μm. A light-receiving/emitting section 9*a* is provided on the photoelectric conversion element 9. A plurality of bumps 11 are provided on the coupling surface 5 of the device array 1, the bumps being arranged parallel to the photoelectric conversion elements. The plurality of bumps 11 function as electrode terminals for supplying electricity to the photoelectric conversion elements 9, or for transmitting a signal from the photoelectric conversion elements 9.

The ferrule 31 has optical fiber insertion holes 33, through which the optical fiber 13 is inserted, arranged in one row at a pitch corresponding with the arrangement pitch of the photoelectric conversion element 9. The insertion holes 33 open onto an end surface (coupling surface 35) that faces the coupling surface 5 of the device array 1. The holding section of the insertion hole 33 for holding the optical fiber 13 anchors the optical fiber 13 with, for example, a thermo-setting adhesive, with which the insertion hole 33 is filled. An electrical circuit 37, to which the bumps 11 are connected, is provided on the coupling surface 35. The electrical circuit 37 is formed continuously on a surface (bottom surface) 39 orthogonally adjacent to the coupling surface 35.

The plurality of optical fibers 13 are arranged in a row. On the outside of the ferrule 31, the optical fibers form a fiber ribbon coated with an integrated protective coating (not shown). A multi-mode optical fiber is preferably used as the optical fiber 13. An example of an optical fiber that may be used has a core diameter of 50 μm, a cladding diameter of 80 μm, and a coating outer diameter of 125 μm. Using the multi-mode optical fiber enables allowances to be made for a small displacement in an axial direction or in a direction of adjustment during installation.

The device array 1 and the ferrule 31 are coupled to form the optical module 100. The bumps 11 are secured to the electrical circuit 37, whereby the device array 1 is integrally coupled with the ferrule 31. The optical fibers 13 are inserted into the insertion holes 33 after the ferrule 31 and the device array 1 are coupled. The position of the optical fiber 13 is set so that the end surface of a glass fiber 21 at the distal end section of the optical fiber 13 is positioned in the vicinity of the light-receiving/emitting section 9*a* of the photoelectric conversion element 9. The bottom surface 39 of the ferrule 31 is installed on a substrate or the like, thereby allowing the optical module 100 to readily provide electricity to the photoelectric conversion elements 9, or to receive a signal from the photoelectric conversion elements 9, through the electrical circuit 37.

Figure 2:
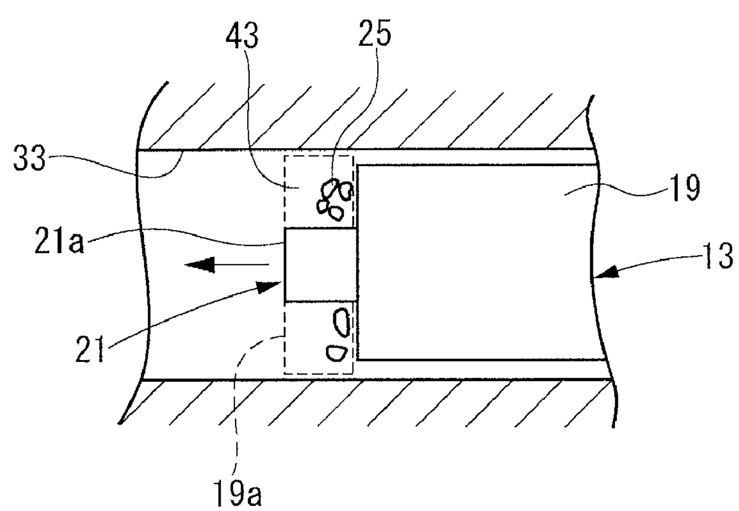
FIG. 2 is an enlarged partial cross-sectional view showing a periphery of a distal end section of an optical fiber under assembling of the optical module in FIG. 1.

FIG. 2 is an enlarged partial cross-sectional view showing the periphery of a distal end section of the optical fiber 13 under assembling of the optical module 100. A distal end 19*a* of a coating is removed from the distal end section on the optical fiber 13 such that a glass fiber 21 protrudes from a protective coating 19. As a result, an annular space 43 is formed on the outer periphery of the glass fiber 21 when the optical fiber 13 is inserted into the insertion hole 33.

A protrusion length L is set to 5 μm or more and 100 μm or less. As a result, any spillage which may occur from the annular space 43 having inadequate volume, that is, the length L is set to 5 μm or less will be less, of a particulates 25 will be less likely to occur. Furthermore, any scraping, which may be caused by the distal end of the glass fiber having the length of 100 μm or more, of the inner peripheral surface can be effectively prevented.

Although a small amount of the distal end 19*a* of the coating is removed from the optical fiber 13, the distal end of the glass fiber 21 does not scrape against the inner surface of the insertion hole 33 upon insertion of the optical fiber 13. Even if the coating 19, which is softer than the glass fiber 21, scrapes the inner peripheral surface of the insertion hole 33, there will be little likelihood of the inner peripheral surface being abraded and producing fine particulate matter.

Figure 3:
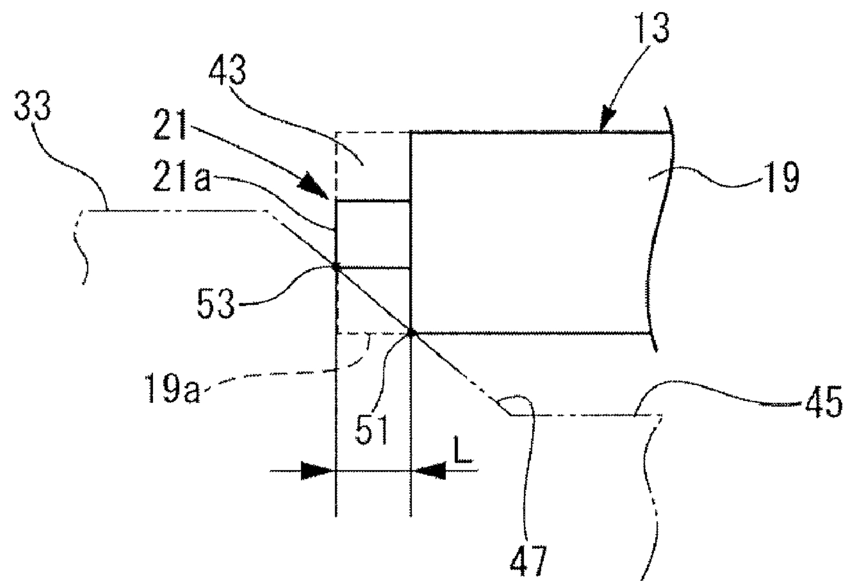
FIG. 3 is an enlarged partial cross-sectional view for explaining a protrusion length in a first modification example of an optical module that is an embodiment of the present invention.

In order to facilitate the insertion operation, the insertion hole 33 may have a holding section, a tapering section 47, and an expanded-diameter section 45 arranged in order from the coupling surface 35 (first modification example). In such an instance, the optical fiber 13 is held in the insertion hole 33 at the holding section. The protrusion length L of the glass fiber 21 is such that the rim 53 of a distal end surface 21*a* of the glass fiber 21 does not contact the tapering section 47 when the rim 51 of the coating 19 is in a state of contact with the tapering section 47 (FIG. 3)

The distal end of the optical fiber 13 may be severed using a laser. In such an instance, a step can readily be formed because the protective coating tends to burn (melt) under laser irradiation. Furthermore, the periphery of the optical fiber 13 melts slightly, and an edge section of the distal end becomes rounded; as a result, chipping is unlikely to occur even if the distal end of the optical fiber 13 contacts the inner peripheral surface of the insertion hole 33 upon insertion into the optical fiber insertion hole, and there is little risk of the resin being abraded and producing fine particulate matter.

Figure 4:
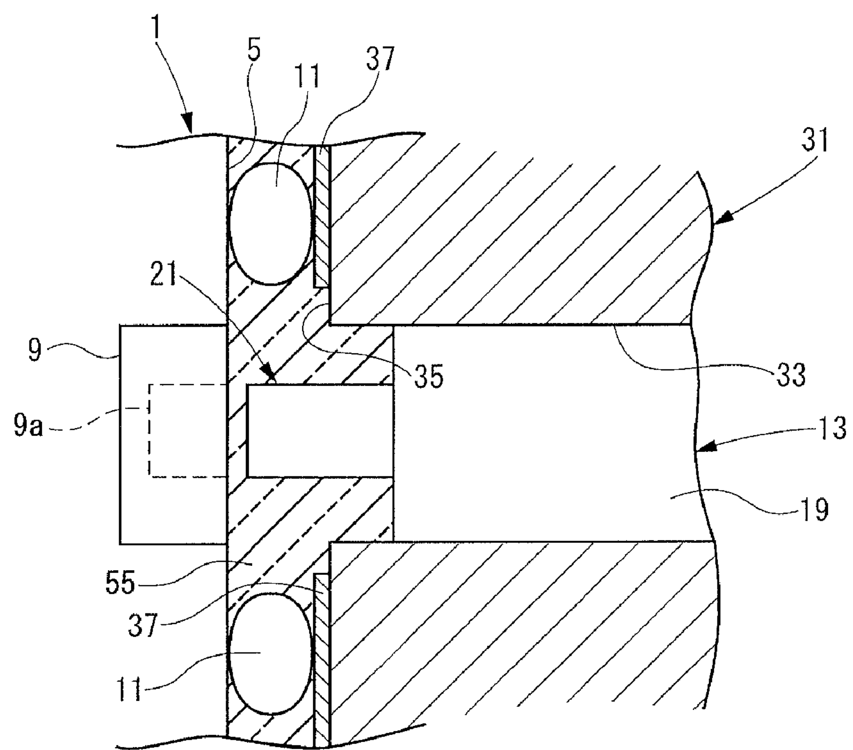
FIG. 4 is an enlarged partial cross-sectional view showing a periphery of a distal end section of an optical fiber in a second modification example of an optical module that is an embodiment of the present invention.
Figure 5:
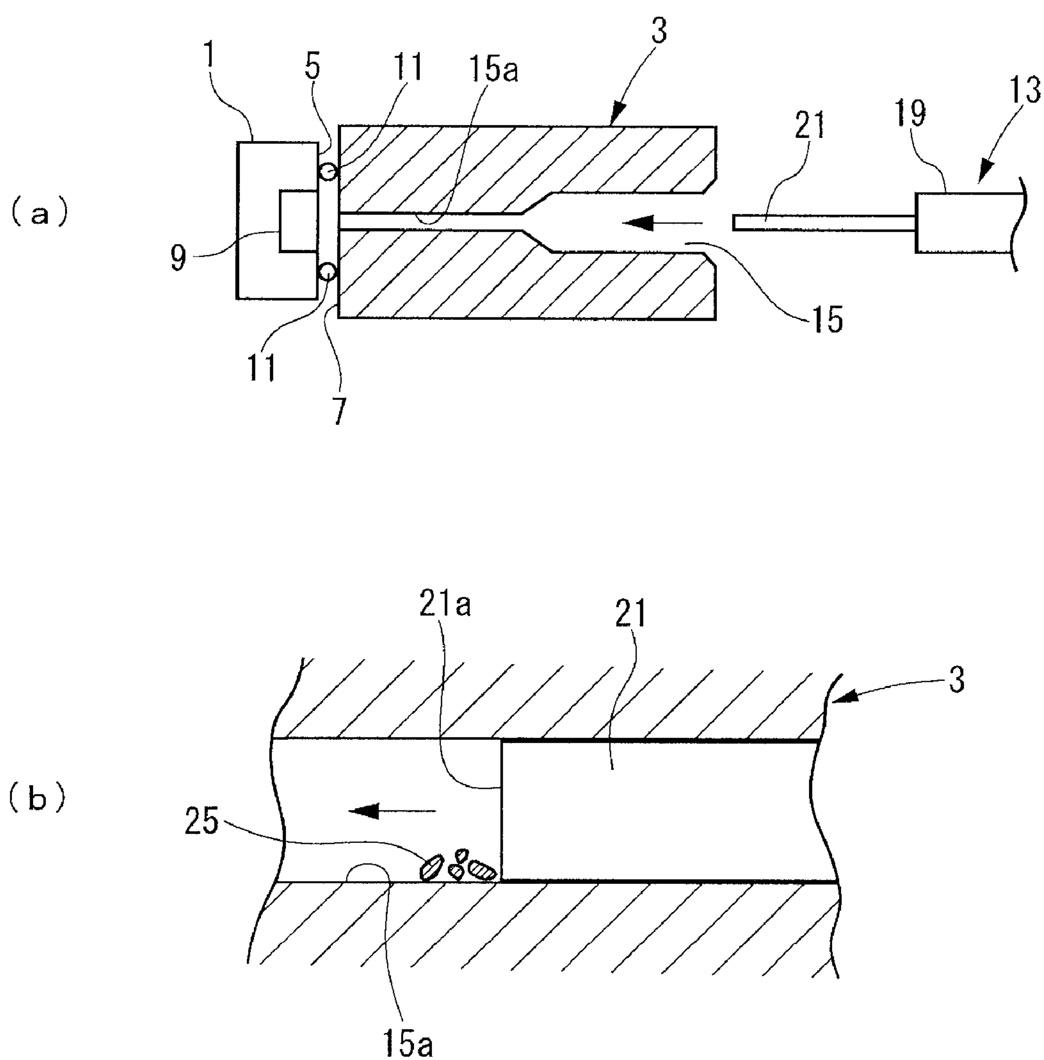
In FIG. 5, region (a) is a cross-sectional view of a conventional optical module prior to assembling, and region (b) is an enlarged partial cross-sectional view of the periphery of a distal end of a glass fiber under assembling.

FIG. 4 is an enlarged partial cross-sectional view showing the periphery of the distal end section of the optical fiber 13 in a second modification example of an optical module that is an embodiment of the present invention. In the second modification example, the glass fiber 21 protrudes slightly at the distal end section of the optical fiber 13, and an outer periphery of the glass fiber 21 is coated in an adhesive 55 made of a transparent resin. The result allows the optical fiber 13 and the adhesive 55 to adhere strongly with each other in comparison to an instance in which the coating 19 extends to the distal end, and reduces the likelihood of a deviation occurring in positional alignment with the light-receiving/emitting section 9*a* even under the effect of external factors such as a temperature change. The adhesive 55 functions as reinforcement means for making it possible to improve the strength of connection between the photoelectric conversion element 9 and the glass fiber 21 exposed at the distal end of optical fiber 13 in the direction of insertion while it also anchors the optical fiber.

Preferably, the refractive index of the adhesive substantially matches the refractive index of the glass fiber. Reflection caused by a difference in refractive indices is minimized, thereby allowing the optical properties to be improved. A UV/thermo-setting resin is preferably used as the adhesive. After UV light is used to perform preliminary anchoring, the article may be taken out of a jig and heated in order to harden sections that have not been hardened by the UV light because they were out of its range. Productivity is accordingly improved.

In the optical module 100, when the optical fiber 13 is inserted into the insertion hole 33, the outer periphery of the coating 19 is in contact with and slides against the inner peripheral surface of the insertion hole 33, and movement of the optical fiber 13 in the radial direction within the insertion hole 33 is restricted. The glass fiber 21 is kept apart from the inner peripheral surface of the insertion hole 33, and does not slide in contact with the inner peripheral surface of the insertion hole 33. Because the coating 19 is made of a soft material, even if the coating 19 is in contact with and slides against the inner peripheral surface of the insertion hole 33, there is little risk of fine particulate matter being produced by scraping. Even if by chance a particulate is produced or is present, the annular space 43 becomes a space in which the particulate 25 will be accommodated, and the likelihood of the particulate 25 adhering to the distal end surface 21*a* of the fiber is reduced. Because the distal end 19*a* of the coating is positioned within the optical fiber insertion hole 33, the accommodated particulate 25 does not spill out of the hole and does not adhere to the light-receiving/emitting section 9*a*.

According to the optical module 100, therefore, the particulate 25 does not adhere to the distal end surface 21*a* of the fiber or to the photoelectric conversion element, thus preventing a reduction in the efficiency of the optical coupling with the device array and degradation of the anti-noise property of the optical module.

The present application is based on JP-A 2007-303996, which was submitted on Nov. 26, 2007, the content of which being included here as reference.

Industrial Applicability

The optical module according to the present invention is useful for optical transmission within or between electrical devices.

What is claimed is:

1. An optical module, comprising:

a ferrule having a fiber insertion hole extending from a first end of the ferrule to a second end of the ferrule, the second end of the ferrule having an end surface on which an electrical circuit is formed, the fiber insertion hole having an inner surface;

a photoelectric conversion element connected to the electrical circuit and facing the fiber insertion hole; and an optical fiber having a glass fiber and a protective coating covering the glass fiber, the glass fiber having a first outer diameter and the protective coating having a second outer diameter greater than the first outer diameter, an exposed portion of the glass fiber extending out of one end of the protective coating, the optical fiber extending through the fiber insertion hole from the first end of the ferrule to proximate the second end of the ferrule such that the protective coating of the optical fiber is interposed between the inner surface of the fiber insertion hole and the glass fiber, with the entire exposed portion of the glass fiber being spaced apart from the inner surface of the optical fiber insertion hole, and such that the exposed portion of the glass fiber is optically coupled with the photoelectric conversion element.

2. The optical module according to claim 1, wherein the glass fiber protrudes from the protective coating by a length L from a distal end of the protective coating of the optical fiber.

3. The optical module according to claim 2, wherein the fiber insertion hole has a holding section that includes the inner surface that defines a first inner diameter, a tapering section, and an expanded-diameter section arranged in order from the second end of the ferrule to the first end of the ferrule, the expanded-diameter section having a second inner diameter greater than the first inner diameter with the tapering section extending between the holding section and the expanded-diameter section with a conical shape;

the optical fiber is held in the holding section of the fiber insertion hole; and the protrusion length L is such that a rim at a distal end surface of the glass fiber does not contact the tapered section when a rim of the protective coating is in a state of contact with the tapered section during insertion of the optical fiber into the ferrule.

4. The optical module according to claim 2, wherein the second outer diameter is 125 μm and the protrusion length L is between 5 μm and 100 μm.

5. The optical module according to claim 2, wherein the distal end of the protective coating is positioned within the fiber insertion hole.

6. The optical module according to claim 2, wherein the protective coating and the glass fiber laser cut at a distal end section of the protective coating such that a rim of the distal end section of the protective coating is rounded.

7. The optical module according to claim 1, wherein the inner surface of the fiber insertion hole defines an inner diameter that is dimensioned such that the protective coating of the optical fiber contacts the inner surface of the fiber insertion hole with the optical fiber extending through the fiber insertion hole.

* * * * *